United States Patent [19]

Talwar et al.

[11] Patent Number: 4,683,447
[45] Date of Patent: Jul. 28, 1987

[54] VARACTOR TUNING CIRCUIT FOR DIELECTRIC RESONATOR STABILIZED OSCILLATOR

[75] Inventors: Ashok K. Talwar, Westlake Village; William E. Poole, Jr., Newbury Park; Richard B. Steinkolk, Sherman Oaks, all of Calif.

[73] Assignee: Eaton Corporation, Cleveland, Ohio

[21] Appl. No.: 936,228

[22] Filed: Dec. 1, 1986

[51] Int. Cl.$^4$ .................................................. H03J 3/18
[52] U.S. Cl. ................................ 331/177 V; 333/221; 333/235; 334/78
[58] Field of Search ............... 331/96, 107 SL, 177 V; 333/202, 205, 219, 221, 235; 334/15, 45, 78

[56] References Cited

U.S. PATENT DOCUMENTS 4,121,182  10/1978  Makimoto et al. ......... 331/177 V X

FOREIGN PATENT DOCUMENTS 2141880  1/1985  United Kingdom ................. 333/202

OTHER PUBLICATIONS

Kang W. Lee et al, "Varactor Tuned Dielectric Resonator GaAs FET Oscillator N X-Band", 1982 IEEE MTT-S Digest, 0149-645X/82/0000-0274, pp. 274-276.

Uve H. W. Lammers et al, "Microwave Dielectric Resonator-Tuning", Air Force Cambridge Research Laboratories, Hanscom Air Force Base, Mass., Oct. 3, 1974, AD/A-006 689, Distributed by: National Technical Information Service, U.S. Dept. of Commerce.

Primary Examiner—Eugene R. LaRoche
Assistant Examiner—Robert J. Pascal
Attorney, Agent, or Firm—Andrus, Sceales, Starke & Sawall

[57] ABSTRACT

Tuning varactor circuitry is disclosed for a dielectric resonator stabilized oscillator (2). A varactor diode (22) is electrically connected in a loop (24) with an RF bypass capacitor (26), and the voltage across the diode is varied. In a first embodiment, first and second dielectric substrates (36, 38) face each other along the plane of the loop (24), with the loop (24) therebetween. In another embodiment, the loop (24) is around a peripheral side wall (52) of the dielectric resonator substrate (46). In another embodiment, the loop (24) is formed on the same surface (54) of a microstrip circuit substrate (56) with a transmission line (10).

4 Claims, 5 Drawing Figures

VARACTOR TUNING CIRCUIT FOR DIELECTRIC RESONATOR STABILIZED OSCILLATOR

BACKGROUND AND SUMMARY

The invention relates to dielectric resonator stabilized oscillators, and more particularly to a varactor circuit for electronically tuning the resonator.

Dielectric resonators have been used to stabilize the operating frequency of microwave oscillators. Because of the high Q of these resonators, the frequency of oscillation is essentially the same as the resonant frequency of the resonator. A common configuration of such oscillator employs an active circuit with a negative real part of impedance connected to an output transmission line. With no dielectric resonator, the impedance presented by the output transmission line is such that no oscillation occurs. When an appropriate resonator is coupled to the output line, it can present a proper impedance to the active circuit to cause oscillation. This occurs at the resonant frequency of the resonator. If the resonator Q is high, any tuning of the active circuit has little affect on the frequency of oscillation. About 0.1% or 0.2% tuning can be achieved by using a varactor junction diode in the active circuit. However, many applications require greater bandwidth.

It is known in the prior art to vary the resonant frequency of a dielectric resonator by coupling another resonant circuit containing a varactor diode to the resonator. A tuning bandwidth of over 1% has been achieved using this technique.

The present invention provides an improved varactor circuit for tuning the resonator.

DETAILED DESCRIPTION

Prior Art

Figure 1:
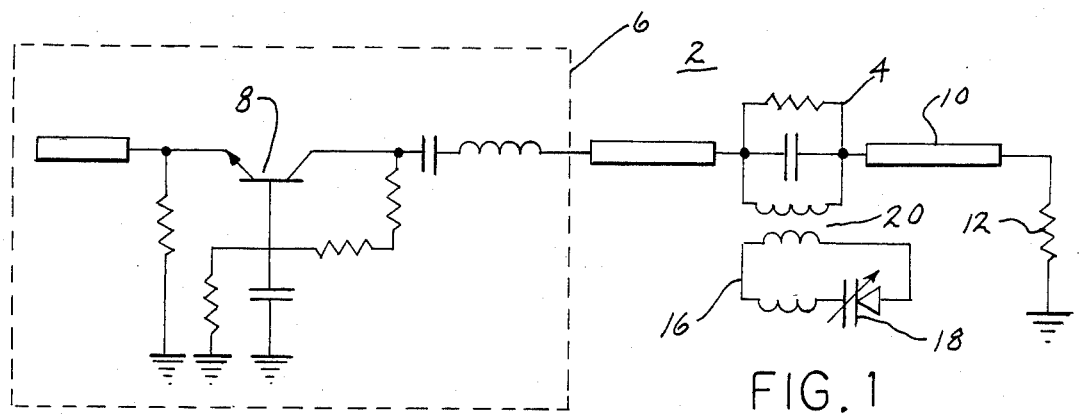
FIG. 1 is a schematic circuit diagram of a dielectric resonator stabilized oscillator with electronic tuning of the resonator, as known in the prior art.

FIG. 1 shows a dielectric resonator stabilized oscillator 2 with electric tuning of the resonator 4. The active network 6 includes a microwave bipolar transistor 8 and associated circuit elements for producing a negative resistance at the frequency of interest, and is connected to output transmission line 10 and load 12. Parallel resonant circuit 4 is connnected in series in the transmission line and provides the dielectric resonator. A tuning circuit 16 including varactor diode 18 is magnetically coupled at 20 to the resonator. As is known, as the capacitance of varactor diode 18 is changed by varying the tuning voltage thereacross, the resonant frequency of the resonant circuit 4 which includes the dielectric resonator changes, which in turn changes the frequency of oscillation of circuit 2, for which further reference may be had to: "Varactor Tuned Dielectric Resonator GaAs FET Oscillator N X-Band", Kang W. Lee et al, 1982 IEEE MTT-S Digest, 0149-645X/82/0000-0274, pp 274-276; "Microwave Dielectric Resonator-Tuning", Uve H. W. Lammers et al, Air Force Cambridge Research Laboratories, Hansom Air Force Base, Mass. Oct. 3, 1974, Distributed By: National Technical Information Service, U.S. Dept. of Commerce.

Figure 2:
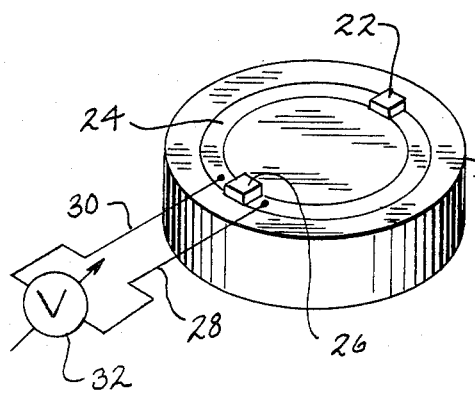
FIG. 2 shows a varactor circuit known in the prior art for tuning a dielectric resonator stabilized oscillator.

FIG. 2 shows a tuning varactor circuit known in the prior art for tuning the dielectric resonator stabilized oscillator of FIG. 1. A varactor diode 22 is electrically connected in an electrically conductive loop or ring 24 with an RF bypass capacitor 26 and has a pair of terminals 28 and 30 for applying a variable bias voltage across the diode from variable voltage source 32. Chip capacitor 26 bypasses the RF signal in order to isolate it from the biasing circuit supplying the tuning volatge. Loop 24, diode 22 and capacitor 26 are formed on a dielectric resonator substrate 34. Loop 24 is copper or other conducting material and provides the magnetic coupling element to resonator circuit 4 in FIG. 1 in close proximity thereto.

Present Invention

Figure 3:
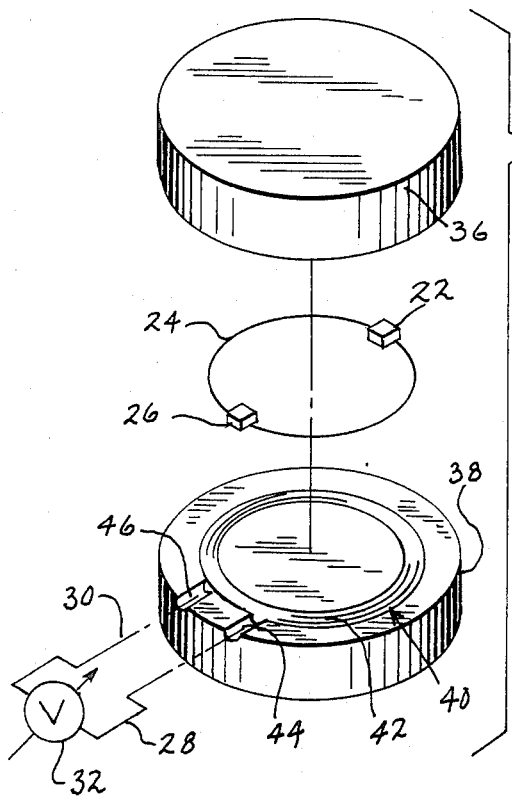
FIG. 3 shows a tuning varactor circuit in accordance with the invention.

FIG. 3 shows a tuning varactor circuit in accordance with the invention, and like reference numerals are used from FIG. 2 where appropriate to facilitate clarity. First and second dielectric resonator substrates 36 and 38 face each other along the plane of loop 24, with loop 24 therebetween. One or both of the substrates has a channel 40 formed therein receiving loop 24 at channel portion 42 and receiving terminals 28 and 30 at respective channel portions 44 and 46, such that substrates 36 and 38 flushly abut each other along the plane of loop 24. This provides improved isolation and coupling, and optimizes the tuning bandwidth because magnetic flux linkage is maximized.

Figure 4:
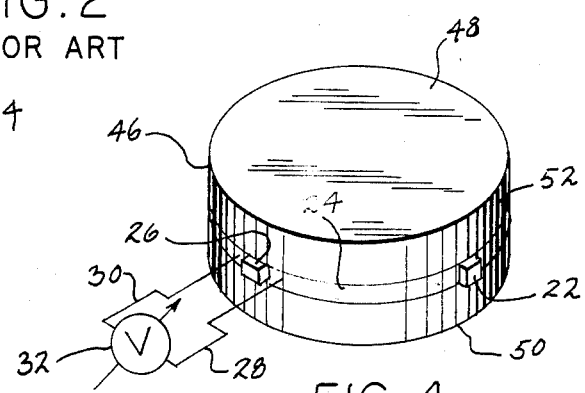
FIG. 4 shows another tuning varactor circuit in accordance with the invention.

FIG. 4 shows another tuning varactor circuit in accordance with the invention, and like reference numerals from FIG. 2 are used where appropriate to facilitate clarity. Dielectric resonator substrate 46 has top and bottom surfaces 48 and 50 and has a peripheral side wall 52 therearound. Loop 24 is disposed around peripheral side wall 52.

Figure 5:
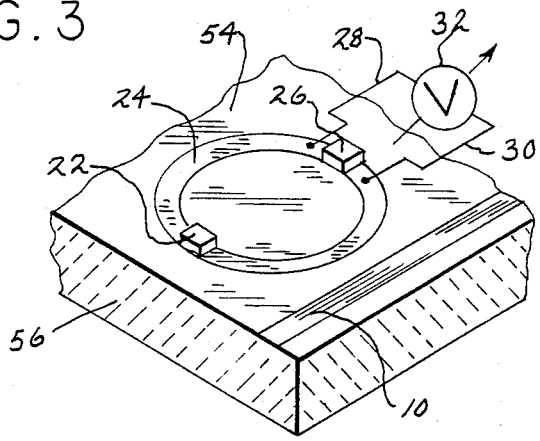
FIG. 5 shows another tuning varactor circuit in accordance with the invention.

FIG. 5 shows another tuning varactor circuit in accordance with the invention, and like reference numerals from FIG. 2 are used where appropriate to facilitate clarity. Loop 24, varactor diode 22 and capacitor 26 are formed on the top planar surface 54 of the same dielectric microstrip circuit substrate 56 as transmission line 10. Loop 24 magnetically couples with the dielectric resonator, preferably placed thereabove, for example as provided by 34, FIG. 2, or 46, FIG. 4. The advantages of the circuit in FIG. 5 are cost effectiveness and relative immunity from vibration.

It is recognized that various equivalents, alternatives and modifications are possible within the scope of the appended claims.

We claim:

1. A tuning varactor circuit for a dielectric resonator stabilized oscillator, comprising a varactor diode electrically connected in an electrically conductive loop with an RF bypass capacitor and having a pair of terminals for applying bias voltage across said diode, and first and second dielectric resonator substrates facing each other along the plane of said loop, with said loop therebetween.

2. The invention according to claim 1 wherein at least one of said substrates has a channel formed therein receiving said loop and said terminals, such that said substrates flushly abut each other.

3. A tuning varactor circuit for a dielectric resonator stabilized oscillator, comprising a dielectric resonator substrate having top and bottom surfaces and having a peripheral side wall therearound, a varactor diode electrically connected in an electrically conductive loop with an RF bypass capacitor and having a pair of terminals for applying bias voltage across said diode, said loop being disposed around said peripheral side wall.

4. A tuning varactor circuit for a dielectric resonator stabilizer oscillator, comprising a microstrip circuit substrate having a top planar surface, a transmission line formed on said top surface, a varactor diode and an RF bypass capacitor electrically connected in an electrically conductive loop formed on said top surface adjacent said transmission line and having a pair of terminals for applying bias voltage across said diode.

* * * * *